United States Patent [19]

Fukuda et al.

[11] Patent Number: 4,748,085

[45] Date of Patent: May 31, 1988

[54] MULTILAYER CERAMIC CIRCUIT BOARD FIRED AT A LOW TEMPERATURE

[75] Inventors: Junzo Fukuda, Nagoya; Masashi Fukaya, Kuwana; Hiroshi Kawabe; Susumu Nishigaki, both of Nagoya, all of Japan

[73] Assignee: Narumi China Corporation, Nagoya, Japan

[21] Appl. No.: 931,697

[22] Filed: Nov. 14, 1986

[30] Foreign Application Priority Data

Nov. 16, 1985 [JP] Japan ................................ 60-255845
Mar. 20, 1986 [JP] Japan ................................ 61-62796

[51] Int. Cl.$^4$ ........................ B32B 15/00; C03C 8/24; C03C 8/14
[52] U.S. Cl. .................................... 428/432; 428/428; 428/901; 501/15; 501/17; 501/65; 501/70; 501/72
[58] Field of Search ........................ 501/15, 17, 65, 70, 501/72; 428/209, 210, 428, 432, 901

[56] References Cited

U.S. PATENT DOCUMENTS 4,401,766 8/1983 Kyle ........................................ 501/15

FOREIGN PATENT DOCUMENTS 0163155 12/1985 European Pat. Off. .............. 501/17

Primary Examiner—John E. Kittle
Assistant Examiner—Patrick J. Ryan
Attorney, Agent, or Firm—Hopgood, Calimafde, Kalil, Blaustein & Judlowe

[57] ABSTRACT

In a multilayer ceramic circuit board comprising a substrate, an insulating layer on the substrate, and a conductive pattern on the insulating layer, an additive of $Cr_2O_3$ or $MnO_2$ is added to the insulating layer to reinforce adhesion between the insulating layer and the conductive pattern. Each of the substrate and the insulating layer is manufactured by firing at a temperature between 800° C. and 1000° C., alumina particles and a glass composition comprising an alumina component. When a total amount of alumina in the substrate is equal to or greater than that in the insulating layer, an amount of $Cr_2O_3$ or $MnO_2$ is restricted to a range between 0.1% and 10.0% by weight, with a difference between the total amounts of alumina falling within a range between 0% and 30% by weight. When the total amount of alumina in the substrate is smaller than that in the insulating layer, the amounts of $Cr_2O_3$ and $MnO_2$ may be between 0.1% and 10.0% by weight and between 0.1% and 15% by weight, respectively. The difference between the total amounts of alumina may be between 0% and 20% by weight.

2 Claims, 1 Drawing Sheet

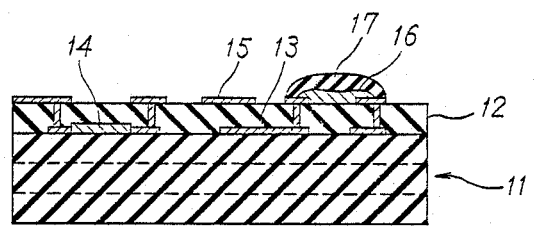

MULTILAYER CERAMIC CIRCUIT BOARD FIRED AT A LOW TEMPERATURE

BACKGROUND OF THE INVENTION

This invention relates to a multilayer ceramic circuit board for use in mounting a semiconductor chip or chips thereon and, in particular, to a multilayer ceramic circuit board fired at a low temperature which may be between 800° C. and 1000° C.

As a rule, a multilayer ceramic circuit board of the type described comprises a plurality of ceramic layers which are stacked together and one of which serves as a substrate. A conductive pattern is deposited or printed on the substrate and is often electrically connected through via holes to another conductive pattern formed on the other ceramic layer that will be called an insulating layer for insulating the conductive patterns from each other. A resistor pattern is often printed on a selected one or ones of the surfaces and is covered with an insulating protection layer to be buried in the multilayer circuit board. The insulating protection layer may be called an insulating protection layer.

In a conventional multilayer ceramic circuit board, each of the ceramic layers and the protection layer is formed by a ceramic material which can be fired at a high temperature, such as 1600° C. In this connection, the conventional multilayer ceramic circuit board may be called a high temperature fired board. The ceramic material has a high dielectric constant. The high temperature fired board needs to use the conductive patterns of a high refractory metal, such as molybdenum or tungsten, having a comparatively high resistivity. Such a high dielectric constant of the ceramic material and such a high resistivity of the high refractory metal lengthen a signal transmission time of an electric signal transmitted through the conductive pattern and become a bar to a high speed operation and a high performance of a computer which uses a great number of multilayer ceramic circuit boards of the type described.

In order to improve the above-mentioned shortcomings of the high temperature fired circuit board, recent interest is directed to a low temperature fired circuit board which is fired at a low temperature less than 1600° C. and, preferably, between 800° C. and 1000° C.

As mentioned before, a resistor pattern is often buried in a multilayer ceramic circuit board and is covered with an insulating protection layer. The resistor pattern is composed of a glass composition and $RuO_2$ or $Bi_2Ru_2O_7$ while the insulating protection layer is usually composed of the same material as the underlying ceramic layer. It is to be noted that a resistance value of the resistor pattern is liable to vary from a desired value during a manufacturing process and that the resistor pattern must be trimmed by the use of a laser beam to adjust the resistance value to the desired one.

When the insulating protection layer is formed by a low temperature fired ceramic material, as described before, it has been found out that the insulating protection layer is inconvenient for trimming the conductive pattern by the laser beam because the laser beam is not easily absorbed into such an insulating protection layer. As a result, the trimming process for the resistor pattern is time-consuming.

In U.S. patent application Ser. No. 740,184, a low temperature fired circuit board is proposed by S. Nishigaki et al and comprises a ceramic layer or layers produced from a mixture of alumina particles and a glass composition comprising by weight 45% to 70% of $SiO_2$, 0% to 30% of $Al_2O_3$, 0% to 30% of $B_2O_3$, and 10% to 55% of CaO and MgO. More particularly, each ceramic layer comprises coexistence of a glass portion uncrystallized and alumina remaining unmelted in the glass portion and is thus formed by a low temperature fired ceramic material. The ceramic layer enables a resistor pattern to be easily trimmed by the laser beam when used as the insulating protection layer.

Such a low temperature fired circuit board can use the conductive patterns of a low resistivity metal, such as silver, gold, platinum. Inasmuch as the low temperature fired ceramic material has a low dielectric constant, it is possible to shorten the signal transmission time by the use of the low temperature fired circuit board.

However, it has been found out that the low temperature fired circuit board is weak in adhesion between the conductive patterns and the ceramic layer. Such adhesion is seriously degraded often a thermal aging process of about 150° C. or so. Besides, such a circuit board is undesiredly warped because shrinkage of the conductive patterns is largely different from shrinkage of the ceramic layers when they are cofired together.

In order to improve adhesion between a ceramic material and a conductive material, an additive, such as glass frit, is often added to the ceramic material, as known in the art. Such addition of glass frit makes wettability of the conductive material to solder become worse and makes warp of a ceramic layer large, when the glass frit is used as the additive on manufacturing the low temperature fired circuit board. Alternatively, it is also known in the art to add, to the ceramic material, another additive, such as CuO, reacting with an alumina component of the ceramic material. However, addition of CuO is scarcely effective to increase the adhesion between the ceramic and the conductive materials because CuO is almost dispersed into the glass portion.

SUMMARY OF THE INVENTION

It is an object of this invention to provide a multilayer circuit board which can be fired at a low temperature and which has excellent adhesion between a conductive pattern and each ceramic layer.

It is another object of this invention to provide a multilayer circuit board of the type described, which is capable of preventing undesired warp of each ceramic layer even on cofiring the conductive pattern and the ceramic layer.

It is still another object of this invention to provide a multilayer circuit board of the type described, wherein it is readily and quickly possible to adjust a resistance value of a resistor pattern to a desired value.

A multilayer ceramic circuit board to which this invention is applicable comprises a substrate, an insulating layer on the substrate, and a conductive pattern on the insulating layer. According to this invention, the insulating layer is produced from a first mixture of alumina particles, a glass composition including an alumina component, and an additive which is rendered into either one of chromic oxide and manganese dioxide when the insulating layer is fired at a processing temperature between 800° C. and 1000° C. The first mixture is specified by a sum of the alumina particles and the alumina component.

BRIEF DESCRIPTION OF THE DRAWING

Figure is a sectional view of a multilayer ceramic circuit board to which this invention is applicable.

DESCRIPTION OF THE PREFERRED EMBODIMENTS

Referring to Figure, description will be made about a general multilayer circuit board to which this invention is applicable and which comprises first and second ceramic layers 11 and 12 stacked together. Each of the first and the second ceramic layers 11 and 12 has an upper and a lower surface directed upwards and downwards of Figure, respectively. The first and the second ceramic layers 11 and 12 may be called a substrate and an insulating layer, respectively. The substrate may be formed either by a single ceramic layer or a plurality of ceramic layers stacked together, as suggested by broken lines. A plurality of conductors, resistors, capacitors (not shown) may be deposited or printed inside the substrate 11 and the insulating layer 12 and on the substrate 11.

In the example being illustrated, the lower surface of the substrate 11 may be called a first board surface while the upper surface of the insulating layer 12 may be called a second board surface.

In Figure, a conductive pattern 13 and a resistor pattern 14 are illustrated on the upper surface of the substrate 11 and are covered with the insulating layer 12. The conductive pattern 13 and the resistor pattern 14 may therefore be called an internal conductive pattern and an internal resistor pattern, respectively. An external conductive pattern 15 is deposited on the insulating layer 12, namely, the second board surface and is electrically connected to the internal conductive pattern 13. An external resistor pattern 16 is also deposited on the insulating layer 12 and covered with an insulating protection layer 17. At any rate, the insulating layer 12 serves to electrically isolate the internal conductive pattern 13 and the internal resistor pattern 14 from the external conductive pattern 15 and the external resistor pattern 17.

With this structure, the external conductive pattern 15 must be firmly adhered to the insulating layer 12 because the external conductive pattern 15 is exposed to an atmosphere. In addition, the internal and the external resistor patterns 14 and 16 might partially be cut away by a laser beam to adjust a resistance value to a desired one.

In a multilayer ceramic circuit board according to a first embodiment of this invention, the insulating layer 12 is produced from a first mixture while the first ceramic layer 11, namely, the substrate is produced from a second mixture.

The first mixture comprises alumina particles having a melting point of 2015° C., a glass composition having a deformation point lower than the first melting point, and an additive for reinforcing adhesion between the insulating layer 12 and the external conductive pattern 15. The deformation point may be equal, for example, to 800° C. or so. The additive may be rendered into manganese dioxide ($MnO_2$) and/or chromic oxide ($Cr_2O_3$) after a heat-treatment is carried out at a processing temperature between 800° C. and 1000° C. An amount of the additive may be between 0.1% and 10% by weight relative to a total amount of the alumina particles and the glass composition when the additive is the chromic oxide. The amount of the additive may be between 0.1% and 15.0% by weight when the additive is the manganese dioxide, as will become clear later.

The alumina particles may include up to 10% of an impurity selected from a group consisting of silica, cordierite, silicon carbide, silicon nitride, forsterite, zirconia, and spinel.

Preferably, the glass composition may be of $CaO$—$Al_2O_3$—$SiO_2$—$B_2O_3$ or $MgO$—$Al_2O_3$—$SiO_2$—$B_2O_3$ and may be used in that described in the above-referenced patent application. The glass composition comprises by weight 45% to 70% of $SiO_2$, 0% to 30% of $Al_2O_3$, 0% to 30% of $B_2O_3$, and 10% to 55% of a sum of CaO and MgO. A mixing ratio of the alumina particles and the glass composition are between 50% : 50% and 35% : 65% by weight. As a result, the insulating layer 12 to 15 which is fired has a first total amount of alumina specified by a sum of the alumina particles and the alumina component included in the glass composition.

On the other hand, the second mixture of the substrate 11 comprises alumina particles and a glass composition which will be referred to as substrate alumina particles and a substrate glass composition, respectively. The substrate glass composition may be of $CaO$—$Al_2O_3$—$SiO_2$—$B_2O_3$ or $MgO$—$Al_2O_3$—$SiO_2$—$B_2O_3$ and therefore essentially comprises an alumina component.

Since any conductive pattern on the substrate 11 is not exposed to the atmosphere, an additive, such as $MnO_2$ and $Cr_2O_3$, may not be added to the second mixture. As regards the substrate 11, a second total amount of alumina is specified by a sum of the substrate alumina particles and the alumina component included in the substrate glass composition. A difference between the first and the second total amounts of alumina in the insulating layer 12 and the substrate 11 falls within a range between 0% and 30% by weight. In the example, selection is made such that the second total sum of alumina in the substrate 11 is equal to or greater than the first total sum of alumina in the insulating layer 12. Preferably, the above-mentioned difference may be between 0% and 20% by weight.

Each of the internal and the external conductive patterns 13 and 15 may be of a low resistance metal, such as gold (Au), silver (Ag), and/or platinum (Pt), which can be fired at a temperature between 800° C. and 1000° C.

Now, description will be made as regards a wide variety of preferred samples according to the first embodiment of this invention together with reference samples.

In order to manufacture the preferred samples and the reference samples, first and second glass compositions #1 and #2 (shown in Table 1) are prepared together with first through fourth conductive paste materials represented by a, b, c, and d, respectively.

TABLE 1

| | CaO (wt %) | $Al_2O_3$ (wt %) | $SiO_2$ (wt %) | $B_2O_3$ (wt %) |
|---|---|---|---|---|
| #1 | 21 | 13 | 57 | 9 |
| #2 | 17 | 4 | 62 | 17 |

As shown in Table 1, the first glass composition #1 comprises by weight 21% of CaO, 13% of $Al_2O_3$, 57% of $SiO_2$, and 9% of $B_2O_3$ while the second glass composition #2 comprises by weight 17% of CaO, 4% of $Al_2O_3$, 62% of $SiO_2$, and 17% of $B_2O_3$. Each of the first and the second glass compositions #1 and #2 belongs to the range disclosed in the above-referenced patent application.

Alumina particles are mixed with each of the first and the second glass composition #1 and #2 at a mixing ratio of alumina particles to glass composition to form the second mixtures which serve as the substrates 11. The mixing ratio of alumina particles to glass composition will be simply called a mixing ratio hereinafter and is varied at every second mixture between 35% : 65% and 50% : 50% by weight.

Likewise, the first mixtures are formed by mixing alumina particles with each of the first and the second glass compositions #1 and #2 at another mixing ratio between 10% : 90% and 50% : 50% by weight. The first mixtures serve as the insulating layers 12. In addition, the first mixtures further include, as the additive, the chromic oxide variable between 0.1% and 10.0% by weight or the manganese dioxide variable between 0.1% and 15.0% by weight.

Each of the first and the second mixtures is mixed with 10% of acrylic resin, 30% of toluene, 10% of isopropyl alcohol, and 5% of dibutyl phthalate into a green sheet for the substrate and the insulating layer. All the percent of acrylic resin, toluene, isopropyl alcohol, and dibutyl phthalate are by weight.

On the other hand, first through fourth conductive paste substances a to d are prepared to form the conductive pattern and are tabulated in Table 2.

TABLE 2

|   | Ag (wt %) | Pd (wt %) | Pt (wt %) |
|---|---|---|---|
| a | 85 | 15 | 0 |
| b | 80 | 20 | 0 |
| c | 70 | 30 | 0 |

TABLE 2-continued

|   | Ag (wt %) | Pd (wt %) | Pt (wt %) |
|---|---|---|---|
| d | 99 | 0 | 1 |

As shown in Table 2, each of the first through fourth paste substances a to d comprises two of low resistance metals which are selected from a group consisting of silver (Ag), palladium (Pd), and platinum (Pt) and which can be fired at the firing temperature between 800° C. and 1000° C. The silver, palladium and platinum have average particle sizes of 0.1 micron, 0.8 micron, and 0.1 micron, respectively. Each of the first through fourth paste substances is attained by preparing four kinds of fine particles comprising the mixtures shown in Table 2 and by dispersing these fine particles into a vehicle which dissolves an organic compound, such as ethyl cellulose, acrylic resin, butyral resin, in a solvent, such as butyl carbitol, butyl carbitol acetate, turpentine oil. Thereafter, each of the first through fourth paste substances a to d is printed by a usual printing method on the green sheet for the insulating layer 12.

Subsequently, the green sheet for the insulating layer is superposed on the green sheet for the substrate to be subjected to a heat treatment at the firing or processing temperature between 800° C. and 1000° C. The resultant insulating layer 12 is united with the substrate 11 with the external conductive pattern 15 deposited on the insulating layer 12.

In the above-mentioned manner, first through thirty-fifth ones of the preferred samples according to this invention are prepared and numbered from 1 to 35 as shown in Table 3. In Table 3, first through fifth ones of the reference samples numbered from 1 to 5 are also shown for the purpose of comparison.

TABLE 3

| | Insulating Layer | | | | Substrate | | | | Conductive Pattern B-A | Firing Temperature | Characteristics of Fixed Articles | | |
|---|---|---|---|---|---|---|---|---|---|---|---|---|---|
| | Glass | Alumina | Total Amount (A) of Alumina | Additive | Glass | Alumina | Total Amount (B) of Alumina | Additive | | | Wettability | Tensile Strength 150° C. | Warp |
| Reference Samples | | | | | | | | | | | | | |
| 1 | #1 60 | 40 | 47.8 | none | #1 60 | 40 | 47.8 | none | 0 | b | 900° C. | 1.11 | 1.07 | 0.04 |
| 2 | #2 60 | " | 42.4 | " | " | " | " | " | " | " | " | 1.21 | 1.01 | 0.06 |
| 3 | #1 70 | 30 | 39.1 | Cr₂O₃ 12.0 | " | " | " | " | 8.7 | " | " | 1.26 | 1.52 | 0.32 |
| 4 | " | " | " | MnO₂ 12.0 | " | " | " | " | " | " | " | 1.16 | 1.13 | 0.02 |
| 5 | " | " | " | CuO 5.0 | " | " | " | " | " | " | " | Unmeasureable | 1.07 | 1.77 |
| Preferred Samples | | | | | | | | | | | | | |
| 1 | #2 60 | 40 | 42.4 | Cr₂O₃ 0.5 | #2 60 | 40 | 42.4 | none | 0 | b | 900° C. | 1.04 | 1.45 | 0.02 |
| 2 | " | " | " | Cr₂O₃ 1.0 | " | " | " | " | " | " | " | 0.91 | 1.65 | " |
| 3 | " | " | " | Cr₂O₃ 2.0 | " | " | " | " | " | " | " | 0.88 | 1.73 | " |
| 4 | " | " | " | Cr₂O₃ 8.0 | " | " | " | " | " | " | " | 0.98 | 1.47 | 0.06 |
| 5 | #2 70 | 30 | 32.8 | Cr₂O₃ 0.5 | " | " | " | " | 9.6 | " | " | 1.09 | 1.80 | 0.01 |
| 6 | " | " | " | Cr₂O₃ 1.0 | " | " | " | " | " | " | " | 1.10 | 1.98 | 0.02 |
| 7 | " | " | " | Cr₂O₃ 2.0 | " | " | " | " | " | " | " | 1.02 | 2.29 | 0.05 |
| 8 | " | " | " | Cr₂O₃ 8.0 | " | " | " | " | " | " | " | 1.07 | 1.86 | 0.09 |
| 9 | #2 80 | 20 | 23.2 | Cr₂O₃ 0.5 | " | " | " | " | 19.2 | " | " | 1.18 | 1.99 | 0.03 |
| 10 | " | " | " | Cr₂O₃ | " | " | " | " | " | " | " | 1.17 | 2.21 | 0.04 |

TABLE 3-continued

| | Insulating Layer | | | | Substrate | | | | | Conductive Pattern | Firing Temperature | Characteristics of Fixed Articles | | |
|---|---|---|---|---|---|---|---|---|---|---|---|---|---|---|
| | Glass | Alumina | Total Amount (A) of Alumina | Additive | Glass | Alumina | Total Amount (B) of Alumina | Additive | B−A | | | Wettability | Tensile Strength 150° C. | Warp |
| 11 | " | " | " | Cr$_2$O$_3$ 1.0 | " | " | " | " | " | " | " | 1.08 | 2.04 | 0.09 |
| 12 | " | " | " | Cr$_2$O$_3$ 2.0 | " | " | " | " | " | " | " | 1.11 | 2.14 | 0.15 |
| 13 | #2 90 | 10 | 13.6 | Cr$_2$O$_3$ 8.0 | " | " | " | " | 28.8 | " | " | 1.09 | 2.11 | 0.12 |
| 14 | #1 60 | 40 | 47.8 | Cr$_2$O$_3$ 2.0 | #1 60 | " | 47.8 | " | 0 | " | " | 1.30 | 2.25 | 0.00 |
| 15 | #2 60 | " | 42.4 | MnO$_2$ 5.0 | #2 60 | " | 42.4 | " | " | " | " | 1.04 | 1.31 | 0.01 |
| 16 | " | " | " | MnO$_2$ 0.5 | " | " | " | " | " | " | " | 0.96 | 1.73 | " |
| 17 | " | " | " | MnO$_2$ 1.0 | " | " | " | " | " | " | " | " | 1.68 | " |
| 18 | " | " | " | MnO$_2$ 2.0 | " | " | " | " | " | " | " | 0.94 | 1.43 | 0.00 |
| 19 | #2 70 | 30 | 32.8 | MnO$_2$ 8.0 | " | " | " | " | 9.6 | " | " | 1.24 | 1.24 | 0.01 |
| 20 | " | " | " | MnO$_2$ 0.5 | " | " | " | " | " | " | " | 1.21 | 1.60 | " |
| 21 | " | " | " | MnO$_2$ 1.0 | " | " | " | " | " | " | " | " | 2.03 | 0.00 |
| 22 | " | " | " | MnO$_2$ 2.0 | " | " | " | " | " | " | " | 1.17 | 1.61 | 0.02 |
| 23 | #2 80 | 20 | 23.2 | MnO$_2$ 8.0 | " | " | " | " | 19.2 | " | " | 1.32 | 1.23 | " |
| 24 | " | " | " | MnO$_2$ 0.5 | " | " | " | " | " | " | " | 1.42 | 1.29 | " |
| 25 | " | " | " | MnO$_2$ 1.0 | " | " | " | " | " | " | " | 1.36 | 1.69 | 0.00 |
| 26 | " | " | " | MnO$_2$ 2.0 | " | " | " | " | " | " | " | 1.41 | 1.42 | " |
| 27 | #2 90 | 10 | 13.6 | MnO$_2$ 8.0 | " | " | " | " | 28.8 | " | " | 1.40 | 2.11 | 0.01 |
| 28 | #2 70 | 30 | 32.8 | MnO$_2$ 2.0 | " | " | " | " | 9.6 | a | " | 1.25 | 1.83 | 0.05 |
| 29 | " | " | " | MnO$_2$ 2.0 | " | " | " | " | " | c | 1000° C. | 1.15 | 1.95 | 0.03 |
| 30 | " | " | " | MnO$_2$ 2.0 | " | " | " | " | " | d | 900° C. | 1.02 | 1.43 | 0.06 |
| 31 | " | " | " | MnO$_2$ 2.0 | " | " | " | " | " | b on fired substrate | " | 1.43 | 1.30 | 0.01 |
| 32 | #1 60 | 40 | 47.8 | MnO$_2$ 5.0 | #1 60 | " | 47.8 | " | 0 | b | " | 1.24 | 2.18 | 0.00 |
| 33 | " | " | " | Metal Cr 5.0 | " | " | " | " | " | " | " | 1.11 | 1.75 | 0.02 |
| 34 | " | " | " | Metal Cr 2.0 | " | " | " | " | " | " | " | 1.40 | 1.82 | 0.00 |
| 35 | " | " | " | Mn(CO$_3$)$_2$ 5.0 | " | " | " | " | " | " | " | 1.36 | 1.73 | 0.01 |

As shown in Table 3, each of the insulator layer 12 and the substrate 11 is specified by a species of the glass composition selected from Table 1, the amount of the selected glass composition, the amount of alumina, the total amount of alumina included in each of the first and the second mixtures, and the amount of the additive selected from the group consisting of the manganese dioxide and the chromic oxide. The columns for the total amounts of alumina in the insulating layer and the substrate are labeled A and B in Table 3, respectively. The respective amounts enumerated in Table 3 are measured as regards the green sheets for the insulating layer and the substrate. In other words, measurement is made about the first and the second mixtures for the insulating layer and the substrate, respectively.

In each of the reference samples 1 to 5 and the first through thirty-fifth preferred samples 1 to 35, the substrate 11 comprises the total amount of alumina which is equal to or greater than that of the insulating layer 12. In this connection, differences between the total amounts of alumina in the substrate and the insulating layer are described in the column (B−A) of Table 3.

In Table 3, the species a, b, c, or d of the conductive pattern and the firing temperature are listed in the columns therefor, respectively. The conductive pattern is therefore formed from a selected one of the first through fourth paste substances exemplified in Table 2.

The reference and the preferred samples are fired into fired articles. Characteristics of the fired articles are measured after firing and are enumerated in three columns of Table 3. Specifically, the characteristics of the conductive patterns are evaluated by wettability of solder attached to the conductive patterns, tensile strength of a conductive lead soldered by the solder to the conductive patterns, and a warp or distortion appearing after the firing on the preferred samples and the reference samples.

The wettability of solder is measured by placing a solder ball which has a diameter of 3 mm and which comprises by weight 60% of tin and 40% of lead, by melting the solder ball at the temperature of 230° C., and, thereafter, by observing a reduction of a height of the solder ball. In general, the wettability is improved as the height of the solder ball becomes low.

The tensile strength is measured after thermal aging of 150° C. by a peeling method which is known in the art and which is carried out by attaching the conductive lead to the conductive pattern of 2 millimeters square by the solder and by peeling off the conductive pattern. The warp of each of the preferred samples and the reference samples is measured by inspecting a distance between lowest and highest positions in a unit area of 10 millimeters square.

In Table 3, the first through fifth reference samples 1 to 5 have the characteristics dependent on the additive, such as $Cr_2O_3$, $MnO_2$, CuO. No additive is added to the first and the second reference samples 1 and 2. In this event, the tensile strength of the conductive lead is less than a minimum acceptable value of 1.2 Kg/2mm□. This means that the conductive patterns of the first and the second reference samples 1 and 2 have weak adhesion to the insulating layers. The third and the fourth reference samples 3 and 4 include $Cr_2O_3$ of 12.0% by weight and $MnO_2$ of 12.0% by weight, respectively. The amounts of $Cr_2O_3$ and $MnO_2$ transgress a preferred range between 0.1% and 10.0%. Such excessive addition of $Cr_2O_3$ makes the warp of the fired article larger than a maximum warp of 0.20 mm/10 mm□. On the other hand, excessive addition of $MnO_2$ weakens the tensile strength of the conductive pattern, as is seen from the fourth reference sample 4.

Furthermore, addition of CuO weakens the tensile strength and unpleasingly enlarges the warp of the fired article, as shown in the fifth reference sample 5.

Now, the first through thirty-fifth preferred samples except the thirty-first preferred sample 31 are manufactured by cofiring the substrate, the insulating layer, and the conductive pattern while the thirty-first preferred sample 31 is manufactured by singly firing the green sheet for the substrate, by successively printing an insulating layer and the second paste substance on the green sheet, and by firing the substrate, the insulating layer, and the second paste substance at a temperature of 900° C.

Each of the first through thirty-fifth preferred samples 1 to 35, namely, the fired articles has the wettability less than 1.5 millimeters, the tensile strength greater than 1.2 Kg/2 mm□, and the warp smaller than 0.20 mm/10 mm□. More particularly, the first through fourteenth preferred samples 1 to 14 comprise the insulating layers including, as the additive, the chromic oxide ($Cr_2O_3$) variable between 0.5% and 8.0% by weight. In addition, the insulating layers in the first through fourteenth preferred samples 1 to 14 comprise the mixing ratios of alumina particles to glass composition which are variable between 40% : 60% and 20% : 80% while the substrates in the first through fourteenth preferred samples 1 to 14 comprise, without any additive, the mixing ratios which are kept at 40% : 60%.

In the first through fourth preferred samples 1 to 4 and the fourteenth preferred sample 14, no difference of the total amounts of alumina is present between the substrate and the insulating layer. In the fifth through eighth preferred samples 5 to 8, the total amounts of alumina in the substrates are greater than those of alumina in the insulating layer by 9.6%. In the ninth through thirteenth preferred samples 9 to 13, the substrates are greater in the total amounts of alumina particles than the insulating layers by 19.2%.

Each of the fifteenth through thirty-second preferred samples 15 to 32 comprises, as the additive, the manganese dioxide ($MnO_2$) variable between 0.5% and 8.0% in each insulating layer. The total amounts of alumina in the insulating layers of the fifteenth through thirty-second preferred samples 15 to 32 are varied between 13.6% and 47.8% while the total amounts of alumina in the substrates of the fifteenth through thirty-first preferred samples 15 to 31 are kept at 42.8%, with the total amount of alumina in the substrate of the thirty-second preferred sample 32 alone kept at 47.8%. Thus, differences between the total amounts of alumina in the substrates and the insulating layers may be varied from 0% to 28.8%.

The thirty-third through thirty-fifth preferred samples 33 to 35 comprise the additives of metal chromium (Cr) and $Mn(CO_2)_3$. Each of such additives is rendered into either the chromic oxide and the manganese dioxide less than 10% by weight when it is fired.

As mentioned above, the substrates in the first through thirty-fifth preferred samples comprise total amounts of alumina equal to or quarter than those of the insulating layers. Therefore, the substrates of the first through thirty-fifth preferred samples 1 to 35 have excellent physical strength because the physical strength is dependent on the total amounts of alumina.

Anyway, the amount of the additive, such as $Cr_2O_3$ or $MnO_2$, is restricted to the range between 0.1% and 10% by weight when a comparatively small amount of alumina is included in the insulating layer in comparison with the substrate.

Next, first through thirty-second preferred samples 1' to 32' according to a second embodiment of this invention will be described by the use of Table 4. In Table 4, each of the first through thirty-second preferred samples 1' to 32' is specified by factors described in conjunction with Table 3 and is manufactured like in Table 3. For the purpose of comparison, first through third reference samples 1' to 3' are also shown in Table 4. The preferred samples 1' to 32' and the first through third reference samples 1' to 3' will also be referred to as fired articles.

TABLE 4

| | Insulating Layer | | | | Substrate | | | | Conductive Pattern | Firing Temperature | Characteristics of Fixed Articles | | |
|---|---|---|---|---|---|---|---|---|---|---|---|---|---|
| | Glass | Alumina | Total Amount (A) of Additive | Additive | Glass | Alumina | Total Amount (B) of Alumina | Additive | A-B | | | Wettability | Tensile Strength 150° C. | Warp |
| Reference Samples | | | | | | | | | | | | | | |
| 1' | #1 50 | 50 | 56.5 | $Cr_2O_3$ | #1 60 | 40 | 47.8 | none | 8.7 | b | 900° C. | 0.93 | 1.83 | 0.51 |

TABLE 4-continued

| | Insulating Layer | | | | Substrate | | | | Con- | | Characteristics of Fixed Articles | | |
| | | | | | | | | | duc- | | | | |
| | | | Total | | | | Total | | tive | Firing | | Tensile | |
| | | Alu- | Amount | Ad- | | Alu- | Amount | Addi- | Pat- | Tempera- | Wetta- | Strength | |
| | Glass | mina | (A) of Additive | di-tive | Glass | mina | (B) of Alumina | tive | A-B | tern | ture | bility | 150° C. | Warp |
|---|---|---|---|---|---|---|---|---|---|---|---|---|---|---|
| 2' | " | " | " | 12.0 MnO$_2$ | " | " | " | " | " | " | " | 1.23 | 1.13 | 0.10 |
| 3' | " | " | " | 20.0 none | " | " | " | " | " | " | " | 0.97 | 1.02 | 0.02 |
| Preferred Samples | | | | | | | | | | | | | | |
| 1' | #1 50 | 50 | 56.5 | Cr$_2$O$_3$ 0.5 | #1 60 | 40 | 47.8 | none | 8.7 | b | 900° C. | 0.91 | 1.80 | 0.02 |
| 2' | " | " | " | Cr$_2$O$_3$ 1.0 | " | " | " | " | " | " | " | 0.92 | 1.88 | 0.10 |
| 3' | " | " | " | Cr$_2$O$_3$ 2.0 | " | " | " | " | " | " | " | 0.83 | 1.78 | 0.11 |
| 4' | " | " | " | Cr$_2$O$_3$ 8.0 | " | " | " | " | " | " | " | 0.99 | 2.19 | 0.12 |
| 5' | #1 40 | 60 | 65.2 | Cr$_2$O$_3$ 0.5 | " | " | " | " | 17.4 | " | " | 0.83 | 1.66 | 0.04 |
| 6' | " | " | " | Cr$_2$O$_3$ 1.0 | " | " | " | " | " | " | " | 0.96 | 1.75 | 0.07 |
| 7' | " | " | " | Cr$_2$O$_3$ 2.0 | " | " | " | " | " | " | " | 0.88 | 2.07 | 0.10 |
| 8' | " | " | " | Cr$_2$O$_3$ 8.0 | " | " | " | " | " | " | " | 0.95 | 1.87 | 0.18 |
| 9' | #1 50 | 50 | 56.5 | MnO$_2$ 0.5 | " | " | " | " | 8.7 | " | " | 1.13 | 1.34 | 0.02 |
| 10' | " | " | " | MnO$_2$ 1.0 | " | " | " | " | " | " | " | 1.11 | 2.13 | 0.05 |
| 11' | " | " | " | MnO$_2$ 2.0 | " | " | " | " | " | " | " | 1.26 | 2.45 | 0.04 |
| 12' | " | " | " | MnO$_2$ 8.0 | " | " | " | " | " | " | " | 1.13 | 1.68 | 0.06 |
| 13' | " | " | " | MnO$_2$ 12.0 | " | " | " | " | " | " | " | 1.24 | 1.50 | 0.08 |
| 14' | #1 40 | 60 | 65.2 | MnO$_2$ 0.5 | " | " | " | " | 17.4 | " | " | 1.02 | 1.27 | 0.03 |
| 15' | " | " | " | MnO$_2$ 1.0 | " | " | " | " | " | " | " | 1.13 | 1.94 | 0.05 |
| 16' | " | " | " | MnO$_2$ 2.0 | " | " | " | " | " | " | " | 1.06 | 2.23 | 0.06 |
| 17' | " | " | " | MnO$_2$ 8.0 | " | " | " | " | " | " | " | 1.02 | 1.38 | 0.14 |
| 18' | " | " | " | MnO$_2$ 12.0 | " | " | " | " | " | " | " | 1.04 | 1.31 | 0.13 |
| 19' | " | " | " | MnO$_2$ 6.0 | " | " | " | " | " | b* | " | 0.95 | 1.44 | 0.02 |
| 20' | " | " | " | MnO$_2$ 10.0 | " | " | " | " | " | " | " | 1.02 | 1.47 | 0.00 |
| 21' | " | " | " | MnO$_2$ 10.0 | " | " | " | " | " | d | " | 0.80 | 2.01 | 0.01 |
| 22' | " | " | " | MnO$_2$ 12.0 | " | " | " | " | " | b* | " | 0.97 | 1.39 | 0.00 |
| 23' | " | " | " | MnO$_2$ 2.0 | #1 45 | 55 | 60.9 | " | 4.3 | b | " | 0.93 | 2.11 | 0.09 |
| 24' | " | " | " | MnO$_2$ 2.0 | #1 40 | 60 | 65.2 | " | 0 | " | " | 0.88 | 2.00 | 0.13 |
| 25' | #2 50 | 50 | 52.0 | MnO$_2$ 2.0 | #2 60 | 40 | 42.4 | " | 9.6 | a | " | 0.93 | 1.82 | 0.03 |
| 26' | " | " | " | MnO$_2$ 2.0 | " | " | " | " | " | c | 1000° C. | 1.24 | 1.70 | 0.02 |
| 27' | " | " | " | MnO$_2$ 2.0 | " | " | " | " | " | d | 900° C. | 0.82 | 1.53 | 0.01 |
| 28' | " | " | " | MnO$_2$ 2.0 | #2 50 | 50 | 52.0 | " | 0 | b | " | 0.98 | 2.03 | 0.07 |
| 29' | #1 50 | " | 56.5 | MnO$_2$ 2.0 | #1 60 | 40 | 47.8 | " | 8.7 | b* | " | 0.92 | 1.49 | 0.01 |
| 30' | " | " | " | MnO$_2$ 2.0 | " | " | " | " | " | b | " | 1.11 | 1.40 | " |
| 31' | " | " | " | MnO$_2$ 2.0 | #1 50 | 50 | 56.5 | MnO$_2$ | 0 | " | " | 1.14 | 1.39 | 0.02 |
| 32' | #2 50 | " | 52.0 | Metal Cr 5.0 | #2 60 | 40 | 42.4 | " | 9.6 | " | " | " | 1.72 | 0.05 |

(b* and d* were deposited on fired substrates.)

It is to be noted in Table 4 that the insulating layer of each fired article has the total amount of alumina which is not smaller than that of the substrate of each fired article.

More specifically, each of the first through third reference samples 1' to 3' comprises the insulating layer formed by the alumina particles and the first glass composition #1 which are mixed with each other at the mixing ratio of 50% : 50%. Excessive amounts of $Cr_2O_3$ and $MnO_2$ are added to the insulating layers of the first and the second reference samples 1' and 2' while none of $Cr_2O_3$ and $MnO_2$ is added to the insulating layer of the third reference sample 3'

Preferably, the wettability and the tensile strength are smaller than 1.5 mm and greater than 1.2 Kg/2 mm$^\square$, respectively, while the warp is smaller than 0.20 mm/10 mm$^\square$, as already mentioned before. Taking these conditions into consideration, the first through third reference samples 1' to 3' are insufficient in either one of the tensile strength and the warp as shown in Table 4.

On the other hand, the first through thirty-second preferred samples 1' to 32' satisfy all of the above-mentioned conditions, as shown in Table 4. The first through thirty-second preferred samples 1' to 32' except the twenty-ninth preferred sample 29' are manufactured by cofiring green sheets for the substrate and the insulating layer while the twenty-ninth preferred sample 29' is manufactured by printing an insulating layer on a green sheet for the substrate, by printing each paste substance on the insulating layer to form a stacked body, and by firing the stacked body at the temperature of 900° C. into the fired article. The insulating layers of the first through eighth preferred samples 1' to 8' comprise as the additive the chromic oxide ($Cr_2O_3$) variable between 0.5% and 8.0% by weight. Each insulating layer of the first through eighth preferred samples 1' to 8' is formed by the first glass composition which is listed in Table 1 and which is mixed with the alumina particles. The mixing ratios of alumina particles to glass composition are varied between the first through fourth preferred samples 1' to 4' the fifth through eighth preferred samples 5' to 8' As a result, the total amounts of alumina in the insulating layers of the first through fourth preferred samples 1' to 4' are equal to 56.5% by weight while the total amounts of alumina in the insulating layers of the fifth through eighth preferred samples 5' to 8' are equal to 65.2% by weight.

On each insulating layer of the first through eighth preferred samples 1' to 8', the conductive pattern is deposited by the use of the second paste substance b listed in Table 2.

The substrates of the first through eighth preferred samples 1' to 8' are formed by the alumina particles mixed with the first glass composition at that constant mixing ratio of alumina particles to glass composition which is equal to 40% : 60%. Thus, the total amounts of alumina in the substrates are equal to 47.8% by weight. The resultant total amounts of alumina in the insulating layers are greater than those in the substrates by 8.7% and 17.4%.

From the first through eighth preferred samples 1' to 8', it is seen that the warps of the samples tend to become large with an increase of the amount of $Cr_2O_3$. According to the inventors' experimental studies, it has been found out that the warps of the fired articles exceed 0.20 mm/10 mm$\square$ if the amount of $Cr_2O_3$ is greater than 10.0% by weight. Inasmuch as no addition of $Cr_2O_3$ weakens the tensile strength of the conductive pattern, as exemplified by the third reference sample 3', the amount of $Cr_2O_3$ must be restricted to a range between 0.1% and 10.0% by weight, like in the first embodiment.

As regards the ninth through thirty-first preferred samples 9' to 31', the insulating layers comprise, as the additive, the manganese oxide ($MnO_2$) variable between 0.5% and 12% by weight. Addition of $MnO_2$ brings about an increase of the tensile strength when the amount of $MnO_2$ is not greater than 15% by weight.

In the ninth through thirteenth preferred samples 9' to 13', the insulating layers comprise, in addition to variable amounts of $MnO_2$, the alumina particles and the first glass compositions which are mixed at the mixing ratio of 50% : 50% while the substrates comprise the alumina particles and the first glass compositions which are mixed at the mixing ratio of 40% : 60%.

The total amounts of alumina in the insulating layers are greater than those in the substrates by 8.7% by weight and the second paste substances b are printed on the respective insulating layers in the ninth through thirteenth preferred samples 9' to 13'.

In the fourteenth through twenty-second preferred samples 14' to 21', the alumina particles and the first glass compositions are mixed at the mixing ratio of 60% : 40% in the respective insulating layers while the alumina particles and the the first glass compositions are mixed at the mixing ratio of 40% : 60%. The amounts of $MnO_2$ are varied between 0.5% and 12% in the insulating layers of the fourteenth through twenty-first preferred samples 14' to 21'. The second paste substances b are used in the fourteenth through twentieth preferred samples 14' to 20' and the twenty-second preferred sample 22° while the fourth paste substance d is used in the twenty-first preferred sample 21'.

In the twenty-third preferred samples 23', the alumina particles and the first glass composition #1 are mixed at the mixing ratio of 55% : 45% in the substrate while the mixing ratio thereof is kept at 60% : 40% in the insulating layer which comprises 2.0% of $MnO_2$ and on which the conductive pattern of at the second paste substance b is printed. In this event, a difference between the total amounts of alumina in the insulating layer and the substrate is equal to 4.3%.

In the twenty-fourth preferred sample 24', the alumina particles and the first glass compositions are mixed with each other at the same mixing ratio in the insulating layer and the substrate. In this connection, the total amount of alumina in the insulating layer is equal to that in the substrate. Therefore, the difference between the total amounts of alumina becomes equal to zero.

In the twenty-fifth through twenty-eighth preferred samples 25' to 28', the second glass compositions #2 are used to form both the insulating layers and the substrates, with 2.0% of $MnO_2$ added to the respective insulating layers. The mixing ratio of alumina articles to glass composition are kept at 50% : 50% in the insulating layers of the twenty-fifth through twenty-eighth preferred samples 25' to 28'. On the other hand, the mixing ratios are equal to 40% : 60% and to 50% : 50% in the substrates of the twenty-fifth through twenty-seventh preferred samples 25' to 27' and in the substrate of the twenty-eighth preferred sample 28', respectively.

The first, third, fourth, and second paste substances a, c, d, and b are used to deposit the conductive patterns in the twenty-fifth through twenty-eighth preferred samples 25' to 28', respectively. As shown in the twenty-eighth preferred sample 28', the characteristics of the fired article can be improved even when no difference between the total amounts of alumina exists between the insulating layer and the substrate.

The twenty-ninth preferred sample 29' is manufactured in the manner different from the remaining samples as mentioned before. On the insulating layer printed and fired on the green sheet for the substrate, the second paste substance b is printed and fired at 900° C., as suggested in Table 4 by b in parentheses.

In the thirteenth and the thirty-first preferred samples 30' and 31', the substrates comprise the alumina particles and the first glass compositions at the mixing ratios different from each other, although the mixing ratios in the substrates are identical with each other and the second paste substance is in common to both the thirtieth and the thirty-first preferred samples 30' and 31'. As shown in the thirty-first preferred sample 31', the additive of $MnO_2$ may be added to the substrate.

The thirty-second preferred sample 32' is formed by adding metal chromium (Cr) of 5.0% by weight to the insulating layer. In this case, the alumina particles are mixed with the second glass compositions #2 at the mixing ratios of 50% : 50% and 40% : 60% to form the insulating layer and the substrate, respectively. The thirty-second preferred sample 32' satisfies the above-mentioned conditions defined in conjunction with the wettability, the tensile strength, and the warp. It has been confirmed that similar characteristics can be accomplished by addition of metal manganese, organic compounds of chromium or manganese. Such organic compounds may be, for example, chromium resinate, manganese resinate, chromium alkoxide, manganese alkoxide, or the like, and may be rendered into chromic oxide or manganese dioxide after firing.

Thus, each insulating layer of the preferred samples 1' to 32' comprises the total amount of alumina which is greater than that of each substrate by an amount less than 20% by weight. With this structure, it is possible to strengthen the conductive pattern against thermal degradation during heat cycles. In addition, an intermediate product is formed by reaction of $Cr_2O_3$ or $MnO_2$ with the alumina component included in the insulating layer and serves to improve adhesion between the conductive pattern and the insulating layer. Such addition of $Cr_2O_3$ or $MnO_2$ is not effective when an excessive amount of alumina is added to the insulating layer so that the difference between the total amounts of alumina exceeds 20% by weight in the internal layer and the substrate. The resultant adhesion between the conductive pattern and the insulating layer becomes weak because a glass component with contributes to adhesion is extremely reduced in the insulating layer.

While this invention has thus far been described in conjunction with a few embodiments thereof, it will readily be possible for those skilled in the art to put this invention into practice in various other manners. For example, the additive of $Cr_2O_3$ or $MnO_2$ may be added either to the insulating protection layer 17 illustrated in Figure or to a selected one or ones of the ceramic layers of the substrate 11. In any event, it has been confirmed that the illustrated insulating layer 11 absorbs a laser beam enough to trim the internal or the external resistor patterns thereunder.

What is claimed is:

1. In a multilayer ceramic circuit board comprising a substrate, an insulating layer on said substrate, and a conductive pattern on said insulating layer, the improvement wherein said insulating layer is produced by firing at a low temperature and comprises:

a first mixture comprising by weight 10%–90% of a first glass component and 90%–10% of a first alumina component, said first glass component comprising by weight 45%–70% of $SiO_2$, 0%–30% of $Al_2O_3$, 0%–30% of $B_2O_3$, and 10%–55% of at least one of CaO and MgO, said first mixture providing a first total amount of alumina determined by said first alumina component and $Al_2O_3$ included in said first glass component;

said substrate comprising a second alumina component and a second glass component of $SiO_2$, $Al_2O_3$, $B_2O_3$, and at least one of CaO and MgO and thereby providing a second total amount of alumina determined by said second alumina component and $Al_2O_3$ included in said second glass component; and said first total amount of alumina being greater than said second total amount of alumina and the difference between said first and said second total amounts of alumina falling within the range between 0%–30% by weight (0% exclusive), said insulating layer comprising an additive which is selected from a group consisting of $MnO_2$ and $Cr_2O_3$ and which is added by 0.1%–10% by weight relative to said first mixture.

2. In a multilayer ceramic circuit board comprising a substrate, an insulating layer on said substrate, and a conductive pattern on said insulating layer, the improvement wherein said insulating layer is produced by firing at a low temperature and comprises:

a first mixture comprising by weight 10%–90% of a first glass component and 90%–10% of a first alumina component, said first glass component comprising by weight 45%–70% of $SiO_2$, 0%–30% of $Al_2O_3$, 0%–30% of $B_2O_3$, and 10%–55% of at least one of CaO and MgO, said first mixture providing a first total amount of alumina determined by said first alumina component and the $Al_2O_3$ included in said first glass component;

said substrate comprising a second alumina component and a second glass component of $SiO_2$, $Al_2O_3$, $B_2O_3$, and at least one of CaO and MgO and thereby providing a second total amount of alumina determined by said second alumina component and $Al_2O_3$ included in said second glass component;

said first total amount of alumina being less than said second total amount of alumina and the difference between said first and said second total amounts of alumina falling within the range between 0%–20% by weight (0% inclusive), said insulating layer comprising an additive which is selected from a group consisting of $MnO_2$ and $Cr_2O_3$ and which is added by 0.1%–15% by weight relative to said first mixture.

* * * * *